(12) United States Patent
Ramanathan et al.

(10) Patent No.: US 8,203,208 B2
(45) Date of Patent: Jun. 19, 2012

(54) THREE-DIMENSIONAL STACKED SUBSTRATE ARRANGEMENTS

(75) Inventors: Shriram Ramanathan, Hillsboro, OR (US); Patrick Morrow, Portland, OR (US); Scott List, Beaverton, OR (US); Michael Y. Chan, Sunnyvale, CA (US); Mauro J. Kobrinsky, Portland, OR (US); Sarah E. Kim, Portland, OR (US); Kevin P. O'Brien, Portland, OR (US); Michael C. Harmes, North Plains, OR (US); Thomas Marieb, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/103,267

(22) Filed: May 9, 2011

(65) Prior Publication Data

US 2011/0260319 A1 Oct. 27, 2011

Related U.S. Application Data

(62) Division of application No. 12/319,035, filed on Dec. 31, 2008, now Pat. No. 7,973,407, which is a division of application No. 10/610,743, filed on Jul. 2, 2003, now abandoned.

(51) Int. Cl.
*H01L 23/48* (2006.01)
*H01L 21/44* (2006.01)
(52) U.S. Cl. ........................ 257/737; 438/613

(58) Field of Classification Search .......... 257/737–738, 257/778–789, E23.108, E23.127; 438/613, 438/675
See application file for complete search history.

(56) References Cited

U.S. PATENT DOCUMENTS

| | | | |
|---|---|---|---|
| 5,462,636 A | 10/1995 | Chen et al. | |
| 5,985,456 A | 11/1999 | Zhou et al. | |
| 6,066,551 A | 5/2000 | Satou et al. | |
| 6,074,895 A | 6/2000 | Dery et al. | |
| 6,127,253 A | 10/2000 | Roldan et al. | |
| 6,177,729 B1 | 1/2001 | Benenati et al. | |
| 6,333,206 B1 | 12/2001 | Ito et al. | |
| 6,495,397 B2 | 12/2002 | Kubota et al. | |
| 6,667,192 B1 | 12/2003 | Patrice et al. | |
| 6,717,252 B2 | 4/2004 | Saeki | |
| 6,724,091 B1* | 4/2004 | Jayaraman et al. | 257/778 |
| 6,750,133 B2 | 6/2004 | Datta | |
| 6,821,878 B2* | 11/2004 | Danvir et al. | 438/613 |
| 6,908,565 B2 | 6/2005 | Kim et al. | |
| 7,129,584 B2* | 10/2006 | Lee | 257/778 |
| 7,135,770 B2 | 11/2006 | Nishiyama et al. | |
| 7,183,648 B2* | 2/2007 | Ramanathan et al. | 257/738 |
| 7,973,407 B2* | 7/2011 | Ramanathan et al. | 257/737 |
| 2002/0070463 A1 | 6/2002 | Chang et al. | |
| 2002/0096761 A1 | 7/2002 | Chen et al. | |
| 2002/0182851 A1 | 12/2002 | Yeh et al. | |
| 2003/0063452 A1 | 4/2003 | Satonaka | |
| 2003/0134450 A1 | 7/2003 | Lee | |
| 2003/0151140 A1 | 8/2003 | Nishiyama et al. | |
| 2004/0169275 A1 | 9/2004 | Danvir et al. | |
| 2005/0003652 A1 | 1/2005 | Ramanathan et al. | |

* cited by examiner

*Primary Examiner* — Calvin Lee
(74) *Attorney, Agent, or Firm* — Winkle, PLLC

(57) ABSTRACT

Three-dimensional stacked substrate arrangements with reliable bonding and inter-substrate protection.

7 Claims, 6 Drawing Sheets

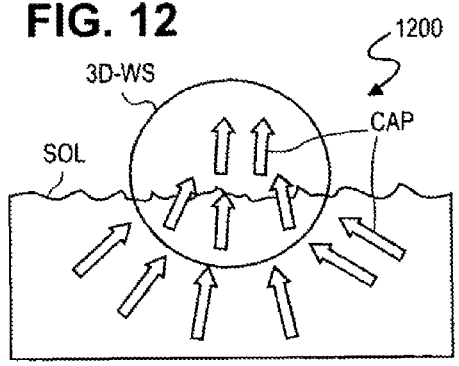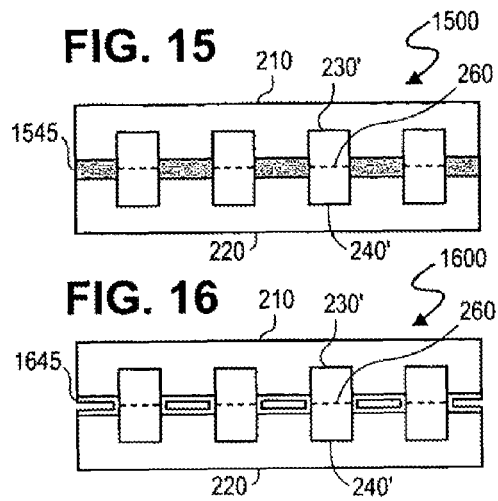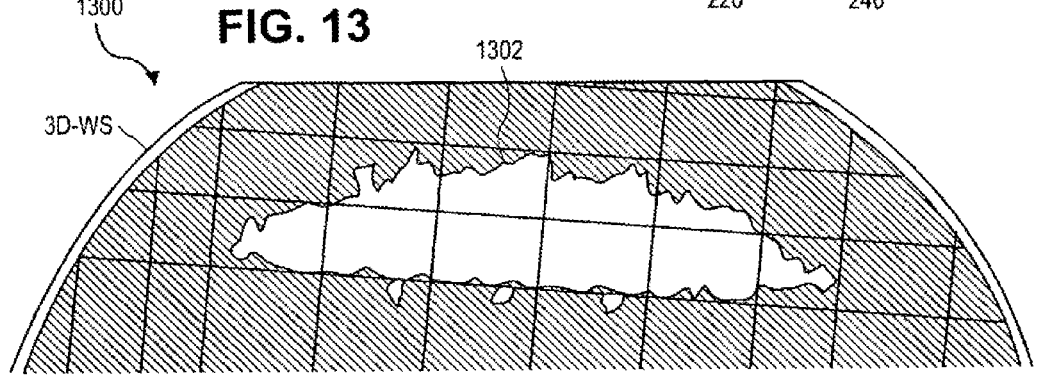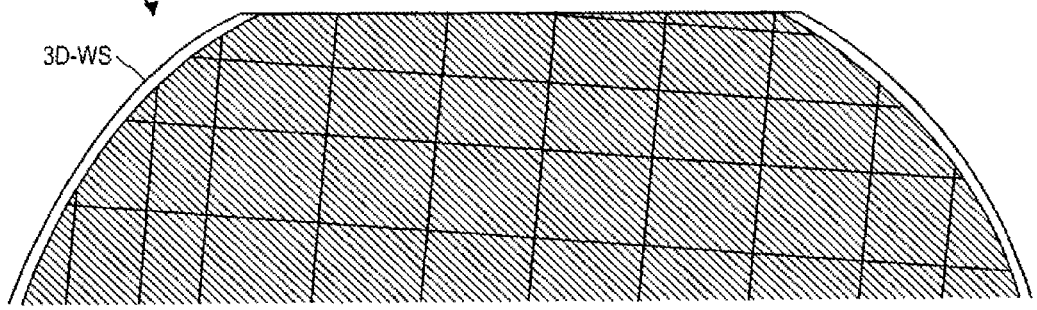

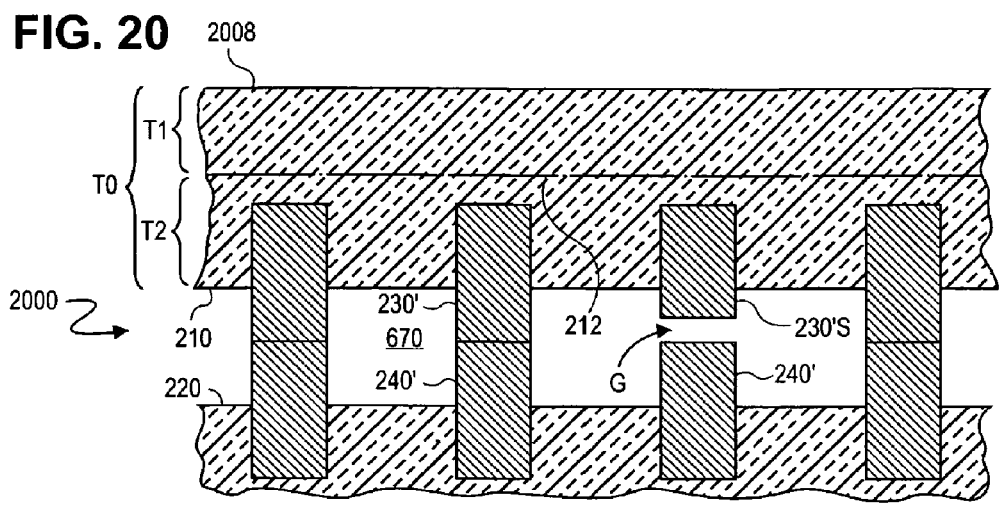
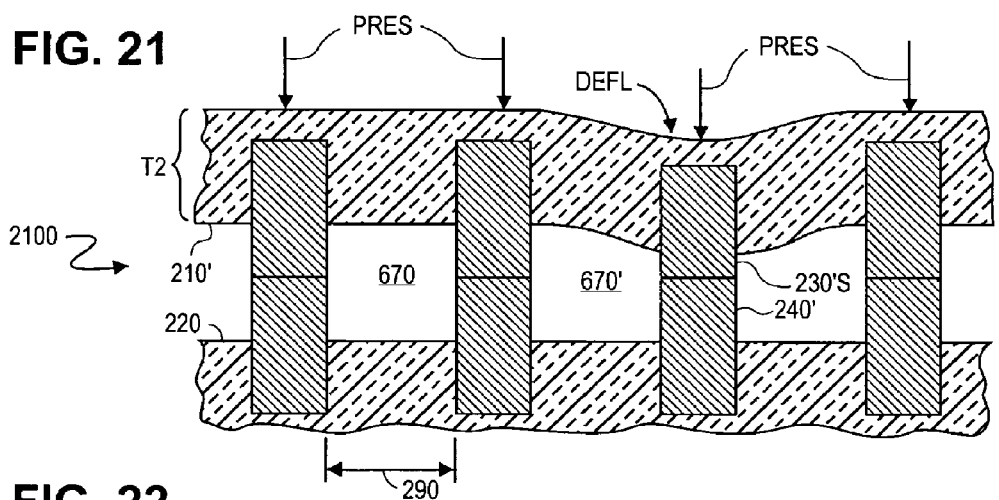
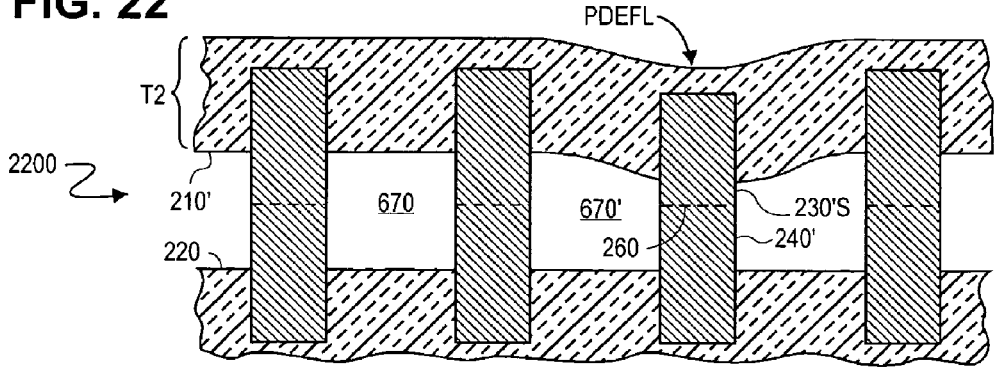

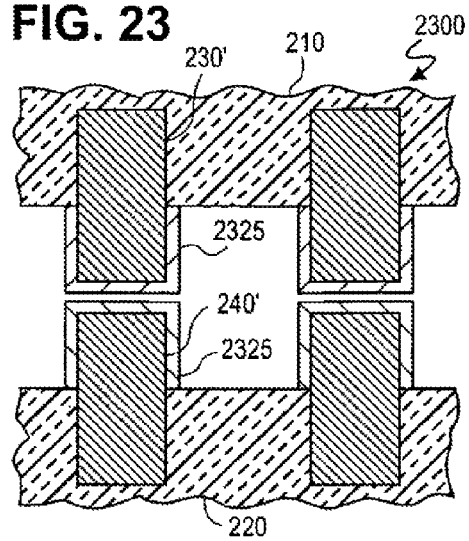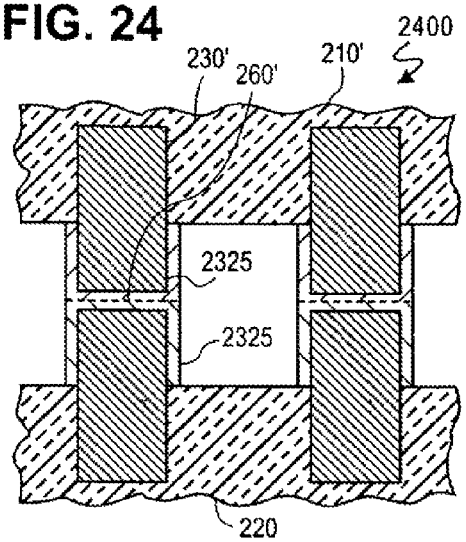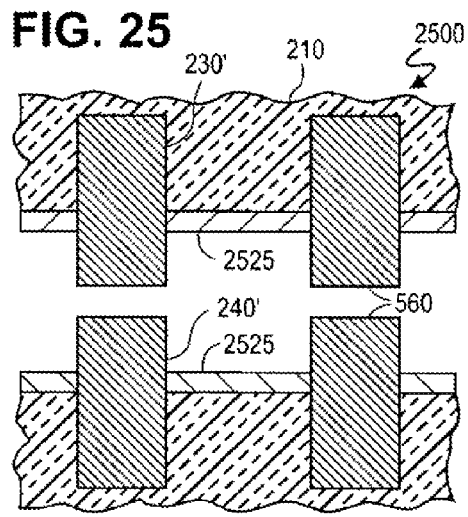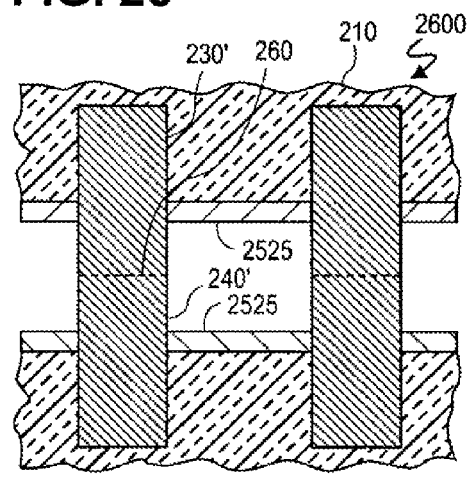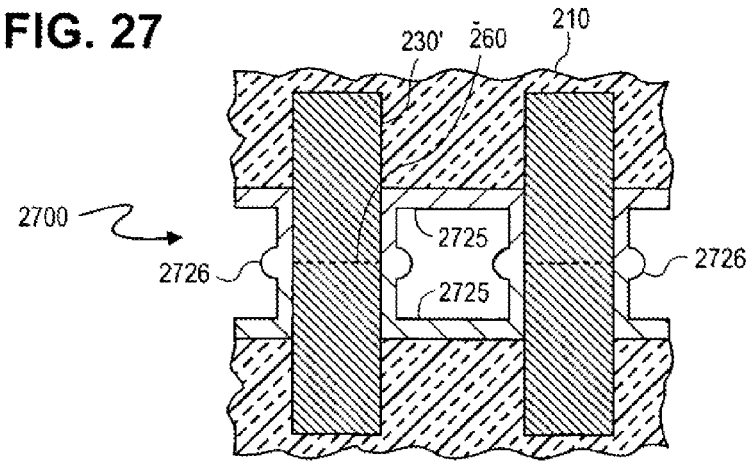

THREE-DIMENSIONAL STACKED SUBSTRATE ARRANGEMENTS

This is a Divisional Application of Ser. No. 12/319,035, filed Dec. 31, 2008, now U.S. Pat. No. 7,973,407, issued Jul. 5, 2011, which is a Divisional Application of Ser. No. 10/610,743, filed on Jul. 2, 2003, now abandoned.

FIELD

The present disclosure relates to three-dimensional stacked substrate arrangements.

BACKGROUND

Three-dimensional stacked substrate (3D-SS) arrangements are electronic devices having a plurality of stacked semiconductor die/chips/wafers that are physically and electrically interconnected with one another. The drive toward achieving 3D-SSs is in its infancy, and numerous technical problems for achieving 3D-SSs have not yet been satisfactorily resolved. Continued solutions and/or improvements are needed.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein:

FIG. 12 is illustrative of yet another advantageous embodiment found to enhance manufacturability and/or reliability of 3D-ICs, i.e., a simplistic cross-sectional view of a set-up using a solution and capillary action to fill material in between bonded substrates;

FIGS. 13-14 are scanning acoustic microscope images regarding various stages of material filled in between bonded substrates as a function of time using the FIG. 12 set up;

FIGS. 15-16 are cross-sections illustrative of advantageous 3D-IC embodiments having inter-substrate and/or pillar passivation and/or support layers enhancing manufacturability and/or reliability of 3D-ICs;

FIGS. 20-22 are illustrative of yet another advantageous embodiment found to enhance manufacturability and/or reliability of 3D-ICs, i.e., substrate thinning and double bonding operations to compensate for pillar height differentials; and FIGS. 23-27 are cross-sections illustrative of additional advantageous 3D-IC embodiments having inter-substrate and/or pillar passivation layers enhancing manufacturability and/or reliability of such 3D-ICs.

DETAILED DESCRIPTION

Figure 1:
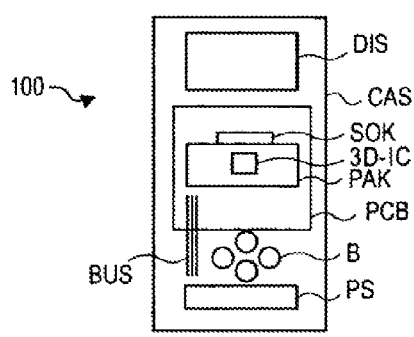
FIG. 1 illustrates example electronic system arrangements that may incorporate 3D-IC implementations of the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/values/ranges/materials may be given, although the present invention is not limited to the same. As manufacturing techniques (e.g., photolithography) mature over time, it is expected that devices, apparatus, etc., of smaller size than those discussed could be manufactured. Well known power/ground connections to components may not be shown within the FIGS. for simplicity of illustration and discussion, and so as not to obscure the invention. Further, arrangements may be shown in simplistic and/or block diagram form in order to avoid obscuring the invention, and also in view of the fact that specifics with respect to implementation of such arrangements are highly dependent upon the platform within which the present invention is to be implemented, i.e., such specifics should be well within purview of one skilled in the art. Where specific details (e.g., circuits, processes) are set forth in order to describe example embodiments of the invention, it should be apparent to one skilled in the art that the invention can be practiced without, or with variation of, these specific details.

Copper wafer bonding is considered to be one of the potential candidates in the fabrication of 3D-SSs. However, copper has a tendency to develop oxide and other contaminants during manufacturing processes. Further, copper has a tendency to diffuse very fast through both silicon and interlayer dielectrics thereby leading to serious reliability concerns (e.g., due to induced short circuits or high leakage currents). Still further, electromigration is also a problem for copper structures without passivation. This disclosure essentially details arrangements (structures, processes, etc.) that can solve (or minimize) the problems related to reliability concerns arising from chipping, various stress-related failures, fracture, excessive Cu diffusion, electromigration and/or corrosion problems related to bonded structures, from a substrate (e.g., die, wafer) bonding perspective.

In practice, many differing types of 3D-SSs may be manufactured. For example, if the stacked substrates are die (i.e., cut from a wafer), then it can be said that a three-dimensional die (3D-D), is formed. An alternative term might be a three-dimensional integrated circuit (3D-IC). Still further, wafers may be stacked/bonded to form a three-dimensional wafer stack (3D-WS), or die could be bonded to wafers.

Although example embodiments of the present invention will be described using example 3D-ICs and/or 3D-WSs having two layers and using copper (Cu) pillar interconnections there-between, practice of the invention is not limited thereto. For example, the invention may be able to be practiced with more than two layers, with other types of substrates, with other (non-pillar) types of interconnections, and with other types of materials besides copper (e.g., aluminum (Al), gold (Au), silver (Ag)).

Turning now to more detailed discussion, FIG. 1 illustrates example electronic system arrangements of differing complexity levels that may incorporate implementations of the present invention. More particularly, at a low level, shown is a 3D-IC that may incorporate one or more implementations of the present invention as a 3D-IC system. Such 3D-IC may be further mounted as part of an electronic package PAK system incorporating the 3D-IC together with supportive components (e.g., a voltage regulator, decoupling capacitors, etc.) onto a substrate (such as a printed circuit board (PCB)). The PAK system may be further mounted, for example, via a socket SOK onto a system printed circuit board PCB (e.g., a motherboard system). The system board may be part of an overall electronic device (e.g., computer, electronic consumer device, server, communication equipment) system 100 that may also include one or more of the following items: input (e.g., user) ports B, output ports (e.g., display DIS, audio system), other peripheral ports (e.g. printer, internet connections, etc.), a bus or bus portion BUS, a power supply arrangement PS, other integrated circuits and chipsets, and a case CAS (e.g., plastic or metal chassis).

Figure 2:
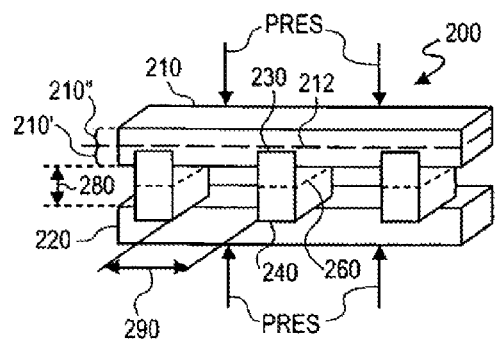
FIG. 2 shows an example three-dimensional cross-sectional view of a small portion of FIG. 1's 3D-IC.

FIG. 2 shows an example three-dimensional cross-sectional view 200 of a small portion of FIG. 1's 3D-IC. Only a very small portion is shown for the sake of simplicity and brevity. Elaborating, FIG. 2 shows a first IC substrate 210 and a second IC substrate 220, and although not explicitly shown within FIG. 2 (and the other FIGS. discussed ahead), the substrates 210, 220 may have predetermined integrated circuits formed thereon. While a 3D stack of only two IC substrates is shown for simplicity, the present invention is by no means limited to a two-substrate stack, i.e., a greater plurality of stacked/interconnected IC substrates may be accomplished with embodiments of the present invention, such as a four or five (or even more) level stack.

Turning to still further description, FIG. 2's small portion shows the first IC substrate 210 having a plurality of interconnection pillars 230, and the second IC substrate 220 having a plurality of (opposing) interconnection pillars 240 (joined at bonds or interfaces 260). The interconnection pillars may be formed, for example, by first forming copper plugs within etched vias in a surface of each IC substrate, then chemically-mechanically polishing (CMP) the plugs/surface in an attempt to achieve plug surfaces in a common plane (planarization), and then performing a selective removal (e.g. selective etching) process to result in slight surface elimination of only substrate material to achieve raised copper pillars.

The first and second IC substrates 210, 220 may then be precisely aligned (i.e., to align opposing pillars) and bonded together (e.g., using pressure forces PRES; typically at elevated temperatures, as shown in FIG. 2) so as to form individual electrical and mechanical interconnections between each interconnection pillar pair 230, 240. While only a few interconnection pillar pairs 230, 240 are shown in FIG. 2 (and other FIGS.) for sake of simplicity, it should be understood that actual practice of a 3D-IC bonding may involve as few as tens or as much as ten of millions of interconnection pillar pairs.

As to an example pillar material, in the present example, the interconnection pillars 230, 240 may both be copper (Cu) pillar interconnections (but may be other types of material, e.g., aluminum (Al), gold (Au), silver (Ag), or alloys of two or more elements). While example embodiments of the interconnection pillars 230, 240 are described as being made of a mutually common material (e.g., Cu), practice of embodiments of the present invention is not limited thereto. That is, the interconnection pillars 230, 240 may be able to be made of mutually differing materials (e.g., Au verses Cu), as long as effective physical bonding and an electrical conduction path can be made between the two.

Overall cooperation of all the bonded interconnection pillars provides a rigid (i.e., permanent) physical bonding of the opposing IC substrates 210, 220 together, while individual bonded interconnection pillars may each provide an electrical conduction path useable to electrically interconnect portions of circuits on the opposing substrates 210, 220.

As to some example dimensions, an inter-substrate spacing 280 (see FIG. 2) after bonding may be in the range 0.01-0.20 µm, while an inter-pillar spacing 290 may be on the order of an example 1-50 µm, or even 3-5 µm. FIG. 2 also illustrates example substrate sub-portions 210' and 210" and a thinning plane 212, but discussion of such items is delayed until further discussions ahead.

Figure 3:
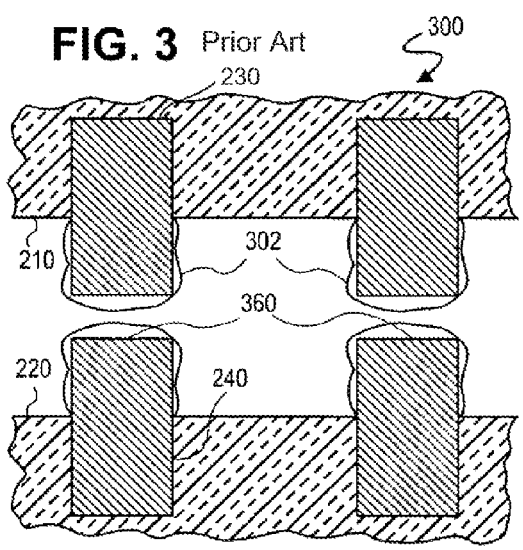
FIGS. 3-4 are cross-sections illustrative of a disadvantageous situation that has been found to possibly negatively affect manufacturability and/or reliability of 3D-ICs.
Figure 4:
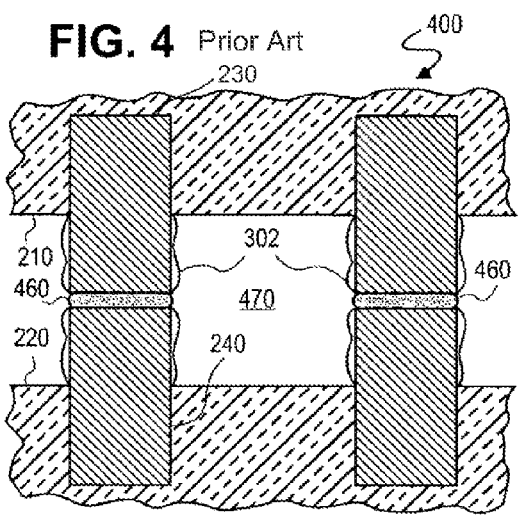

In order for 3D-ICs to gain widespread acceptance in the industry, 3D-ICs must offer both a reasonable level of manufacturability and a high level of reliability. FIGS. 3-4 are illustrative of a disadvantageous situation that has been found to possibly negatively affect manufacturability and/or reliability. That is, a contaminant phenomena may negatively interfere with, and thus affect an integrity of, physical bonding of the opposing substrates 210, 220 together, and/or may negatively affect an integrity or quality of electrical conduction paths of the individual bonded interconnection pillars.

More particularly, during manufacturing, the surfaces of the copper pillars may undergo several polishing and grinding operations during, for example, chemical mechanical polishing (CMP) processes. Such processing may leave a native oxide on top of the Cu surface, and also may leave (e.g., organic) contaminants. It has been found in experimentation directed toward the present invention that the presence of such contaminants may increase the temperature required for a subsequent successful bond. The contaminants may also increase the total resistance of electrical interconnections created by bonding pillars due to the presence of a poor conductor (e.g., oxide) at the bonded interfaces 260.

As an illustration of the above, FIG. 3 shows a greater magnified view 300 of the opposing substrates 210, 220 prior to bonding, with contaminants 302 (e.g., a copper oxide, organic residues) shown formed on exposed surfaces of the opposing pillars 230, 240. Of particular importance, contaminants 302 (FIG. 3) disposed on opposing bonding surfaces 360 of the pillars 230, 240 may lead (FIG. 4) to disadvantageous bonds 460 shown in the FIG. 4 magnified view 400.

More particularly, as far as physical bonding, contaminants 302 may prevent physical bonding, or result in a weakened local physical bond 460. Moreover, the presence of an oxide film may also prevent grain growth across the bonded interfaces, which could lead to a lower bond strength.

As far as affecting an electrical conduction path, the bond 460 containing contaminants 302 may (in a worst case scenario) result in or represent a total disruption in an electrical conduction path intended along a bonded pillar pair (e.g., the oxide/contaminants may act as an interrupting or blocking electrical insulator barrier). Alternatively, the bond may not represent a total disruption and may conduct electricity, but it may still represent an undesirable electrical conduction path portion. For example, bond 460 may act as an unwanted high electrical resistance in comparison to the low resistance copper material of the pillars.

The above may have devastating effects. More particularly, proper formation and operation of the bond/path of each pillar pair between opposing 3D-IC substrates may each be critical to an ultimate successful electrical operation of the 3D-IC, and any failure of any bond/path at the time of manufacturing or at a subsequent time (e.g., during use in the field) may render the 3D-IC (and any apparatus constructed to include the 3D-IC) unusable/inoperable. Accordingly, it is highly desirable that failures be avoided, so as t increase yield and reliability.

In continuing discussions, once the IC substrates 210, 220 have been bonded together, inter-substrate voids (e.g., 470; FIG. 4) are formed, as framed by combinations of the IC substrates 210, 220 and neighboring interconnection pillar pairs 230, 240. In the case of the FIG. 4 embodiment, a void 470 is disadvantageous in that contaminants 302 may line a periphery of the void. Such contaminants may be sources of potential problems during subsequent processing and handling of the 3D-IC. As one example, the contaminants may prevent or degrade a passivation or sealing (discussed ahead) of the 3D-IC.

High temperature bonding offers one solution to the FIGS. 3/4 contaminant problem. That is, high temperature applied during a bonding process tends to remove (e.g., de-oxidize) the contaminants and/or melt opposing pillar pair material (e.g., copper) together. However, high temperature bonding has itself been found to lead to differing problems.

For example, as mentioned previously, Cu has very high diffusivity, even at room temperature. That is, FIG. 7's example magnified view 700 shows a representation (wavy arrows 702, 704) of pillar material (e.g., Cu) diffusing onto and/or into the substrate. (FIG. 7's corrosion CR item will be discussed in later discussions.) Diffusion may cause leaky paths and effectively decrease an electrical spacing between neighboring pillars, and may result in catastrophic short-circuiting and/or discharges (shown representatively by lightning-bolt 706). Furthermore, Cu can diffuse into the dielectric parts of the substrate, which increases leakage currents, or can diffuse into the active Si components in the substrate, which can potentially render them inoperable.

Short-circuiting and or discharges have the potential to destroy an operability of a 3D-IC, and thus, are extremely undesirable. That is, experiments using bias temperature stressing have shown that untreated copper bonds have shown poor reliability characteristics owing to copper diffusion causing, for example, short-circuits. High temperatures typically exacerbate diffusion, and hence, high temperatures (such as high temperature bonding) should be avoided as much as possible during manufacturing. In addition, for example, temperatures higher than 400-500° C. could lead to the destruction of the active Si components of the ICs.

Ultrasonic welding (e.g., the application of ultrasonic energy to vibrate contaminants 302 loose and melt the interconnection pillar pairs 230, 240 together) may offer another solution, but again, ultrasonic welding itself may generate high temperatures and may also lead to other problems (e.g., stress cracking of the IC substrates; loose contaminant material which may negatively affect subsequent processing steps).

In view of the above, it is desirable to perform metal bonding of 3D-ICs at relatively low temperatures in order to avoid reliability concerns. Hence, embodiments of the present invention tend toward arrangements (e.g., process flows) for low temperature bonding of patterned (e.g., with Cu pillars) die/wafers for 3D-IC applications.

More particularly, a first embodiment details arrangements (e.g., process flows) to prepare clean copper surfaces to enable bonding at low temperatures. That is, cleaned surfaces have been found to enable low temperature bonding, and result in lower interfacial resistances.

Low temperature bonding may be defined in any number of differing ways. For copper material, low temperature bonding may be defined as bonding effected at <250° C., or alternatively, at <200° C., or still further, at <150° C. If different pillar material other than copper is used, then a different low temperature may be applicable. As an alternative definition, low temperature may be any temperature enabling less than or not more than a predetermined rate of diffusion of the pillar material during the bonding operation, e.g., enabling less than or not more than a predetermined rate of X atoms/$m^2$s, where X is a selected number, m is meters and s is seconds. A further alternative is to define in terms of ratio of bond temperature to melting point. Using copper as an example, copper's bond temperature to melting point is a ratio of 473K/1357K=0.34. Accordingly, pillar materials useable with embodiments of the present invention may have a ratio of bond temperature to melting point of <0.40, or more particularly <0.35. A lower ratio means that the material will bond at a low temperature in comparison to the melting point; lower temperatures generally mean lower diffusion rates in comparison to a melting point diffusion rate where the material transforms from solid to liquid.

Turning now to a greater detailing of the present embodiment, some important processes with respect to the first embodiment are: (1) obtaining a clean Cu surface by etching, chemical reaction and/or heating prior to bonding to obtain low interfacial resistance; and, (2) subsequent bonding at low temperatures. The following discussions detail some example process flows to prepare clean copper surfaces of starting die or wafers from the point of view of low temperature bonding.

Example Process Flow A (Chemical Cleaning):

Operation 1: The copper pillars 230, 240 of die or wafers of interest (i.e., to be bonded together as a 3D-IC) may be exposed to a mixture of 1:1 $H_2O$:HCl for about 1 minute at room temperature. (Practice of the present invention is not limited thereto, and instead, other types of chemicals, mixtures and/or times may be used for cleaning, and especially if a pillar material other than Cu is used.) Following this operation, the wafers are rinsed in distilled (DI) water and then dried. Such operations result (see FIG. 5's magnified view 500) in a clean copper pillars 230', 240' with surfaces (including bonding surfaces 560) having no native oxide or other contaminants thereon.

Operation 2: The cleaned die or wafers are loaded into an aligner tool and precisely aligned so as to align opposing pillars for bonding.

Operation 3: Quickly (e.g., immediately), or within a predetermined amount of time, after the cleaning operation, the aligned die or wafers are then bonded using a bonder tool at low temperatures (e.g., <200° C.) resulting (see FIG. 6's magnified view 600) in clean copper-copper bonds or interfaces 260. Again, inter-substrate voids 670 are formed as framed by combinations of the IC substrates 210, 220 and neighboring interconnection pillar pairs 230', 240'. In the case of the FIG. 6 embodiment, voids 670 are advantageous (over the FIG. 4 voids 470) in that they are substantially free of contaminants.

Example Process Flow B (Heat/Vapor Cleaning Prior To Bonding):

Operation 1: The copper pillars 230, 240 of die or wafers of interest (i.e., to be bonded together as a 3D-IC) may be heated (e.g., in a processing chamber) to a temperature between 200-350° C. in an inert or reducing atmosphere or in high vacuum (<$10^{-6}$ Torr).

Operation 2: The die or wafers may then be exposed to methanol vapor leaked in at low pressure such as (≈$10^{-6}$ Torr) for a short time (5-15 minutes). Methanol chemically reacts with $Cu_2O$ to form gaseous products such as $CO_2$, $CH_2O$ and CO. This treatment removes any native oxide present on the copper surface and other contaminants. (Again, practice of the present invention is not limited to the temperatures, vapor, pressures and/or times given, and instead, other temperatures, vapor, pressures and/or times may be used for cleaning, and especially if a pillar material other than Cu is used.)

Operation 3: The die or wafers are then cleaned in acetone and ethanol to remove any organic contaminants and this results in a clean surface ready to be bonded. Such operation results (see FIG. 5's magnified view 500) in a clean copper pillars 230', 240' with surfaces (including bonding surfaces 560) having no native oxide.

Operation 4: The two die or wafers to be bonded are precisely aligned using an aligner tool.

Operation 5: Quickly (e.g., immediately), or within a predetermined amount of time, after the cleaning operation, the aligned wafers are bonded using a commercial bonder tool at low temperatures (e.g., <200° C.) resulting (see FIG. 6's magnified view 600) in clean copper-copper bonds or interfaces 260. Again, inter-substrate voids 670 are formed as framed by combinations of the IC substrates 210, 220 and neighboring interconnection pillar pairs 230', 240'. In the case of the FIG. 6 embodiment, voids 670 are advantageous (over the FIG. 4 voids 470) in that they are substantially free of contaminants.

Owing to clean metal surfaces provided, for example, by the above example process flows, it could be possible to perform the bonding process at low temperatures (<250° C., <200° C., or <150° C.), which may reduce a thermal budget (for manufacturing) significantly and which may also minimize undesirable copper diffusion during the bonding process. To summarize, technical advantages of the present invention (e.g., via the above embodiments) include: (1) Cu-Cu bonding at low temperatures, (2) lower interfacial resistance owing to a clean metal-metal interface, (3) increased bond strength owing to a clean metal-metal interface, and (4) lower manufacturing thermal budget.

Discussion turns next to another problem discovered with respect to achieving 3D-SSs. More particularly, attention is directed to FIG. 20 showing a magnified partial cross-sectional view 2000 of the opposing substrates 210, 220. FIG. 20 is especially illustrative of a disadvantageous pillar height differential situation that has been found to occur occasionally and possibly negatively affect manufacturability and/or reliability of 3D-SSs.

More particularly, previously it was mentioned that a chemically-mechanically polishing (CMP) operation may be applied to each substrate's plugs/surface in an attempt to achieve plug surfaces in a common plane (i.e., achieve coplanar plug surfaces/heights). The CMP process (or any other planarizing process used) may be imperfect at times, and may result in disadvantageous pillar height differences. Most differences may be within an acceptable/workable range.

However, substantial differences may result, such as shown by FIG. 20's short interconnection pillar 230'S. Further, although not shown for sake of brevity, equally disadvantageous long interconnection pillars may also occur. That is, for sake of simplicity and brevity, present discussions will focus only on the example of a single short interconnection pillar.

Because of pillar height differences, physical gaps G may exist between ones of the opposing pillar pairs 230'S, 240'. It has been found that unless the bonding operation includes some type of accommodation to compensate or correct for pillar height differences, physical contact/bonding and/or an electrical conduction path may never be formed between affected ones of the pillar pairs 230'S, 240'. As mentioned previously, the bond/path of each pillar pair between opposing 3D-IC substrates may each be critical to an ultimate successful electrical operation of the 3D-IC, and any failure of any bond/path at the time of manufacturing or at a subsequent time (e.g., during use in the field) may render the 3D-IC (and any apparatus which includes the 3D-IC) unusable/inoperable.

Figure 17:
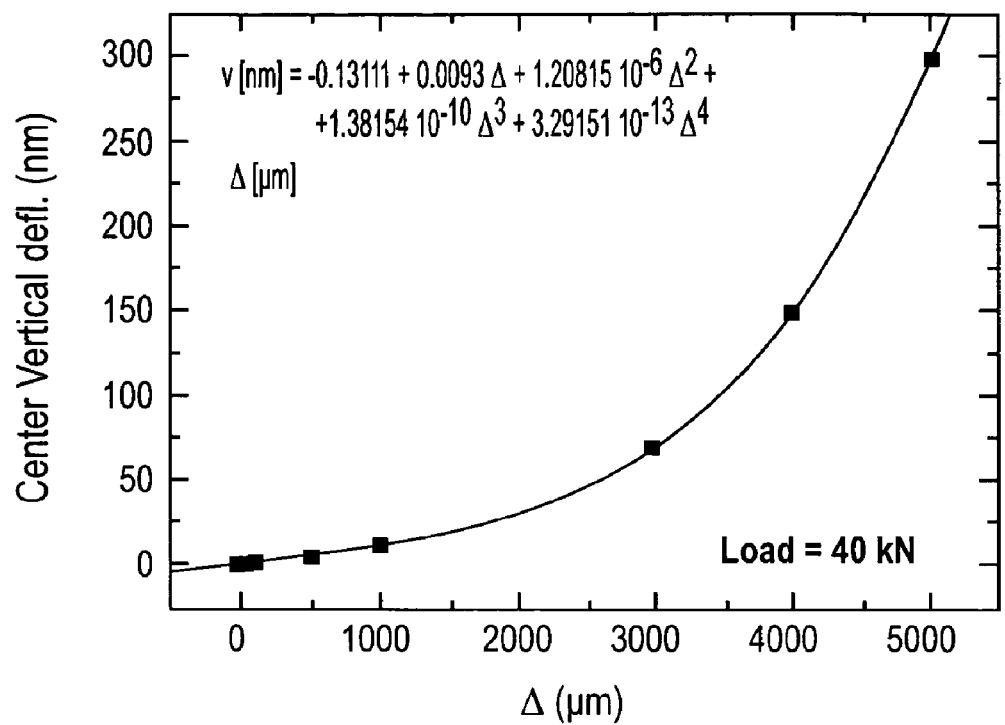
FIGS. 17-18 are graphs detailing experimental results showing deflection of Si wafers at differing thicknesses at an applied pressure, as a function of spacing between pillar structures.

In an attempt to compensate or correct for pillar height differences that may result in practice, pressure (see PRES, FIG. 2) was applied all along both opposing substrates 210, 220. That is, pressure was used experimentally to see if noncontacting pillar pairs 230'S, 240' could be effectively squeezed together to accommodate bonding. FIG. 17 is a graph detailing calculated results showing deflection of Si wafers (average thickness≈700 μm) at an applied pressure of 40 kN as a function of spacing between copper pillar structures. (This graph was obtained by finite element analysis.) Such graph shows that spacing (see 290 in FIG. 2) between neighboring copper pillar structures must be of the order of a substrate/wafer thickness (approximately 1000 μm in this case) before onset of any noticeable deformation of the wafers. However, this inter-pillar spacing represents an unacceptable area requirement for any practical 3D-IC as hundreds (if not ten of millions) of pillar pairs may be required within a very small area between opposing substrates of a 3D-IC.

Based upon the above failure, experimentation was next conducted to see whether wafer thinning could be used to achieve satisfactory deflection for wafers with a more realistic (i.e., acceptable) inter-pillar spacing (e.g., 10 μm). That is, it was checked to see whether sufficient wafer deflection could be achieved to accommodate height variations in copper pillar structures by, for example, first performing an initial bonding, then thinning the backside of at least one die or wafer of the 3D-IC, and then performing a final bonding. Thinning may be accomplished through any known thinning process, e.g., etching, ablation, cleaving, grinding, CMP.

FIGS. 20-22 will be used to describe thinning (e.g., CMP) of only a single wafer 210; however, it should be understood that thinning may likewise be applied to both opposing wafers (e.g., both 210 and 220). With respect to FIGS. 20-22 (as well as other FIGS.), it is noted at this point that thicknesses/sizes may not be drawn to scale, i.e., thicknesses/sizes may be exaggerated for clarity. Further, while FIGS. 20-22 show the substrate 210 (or 210') representatively in a full cut-away thickness, opposing substrate 220 is only shown in partial cut-away thickness due to drawing sheet space limitations.

In beginning to detail an example thinning process flow, once die or wafers are pillar aligned, they may be initially bonded at a low temperature for a short time to form an initial tentatively-bonded 3D-IC structure. Again, a low temperature for initial bonding may be within a range of 150° C. to 250° C., and may, for example, be substantially equal to or less than 200° C. After an initial bonding, the backside of one of the substrates may be ground to a predetermined thinness (e.g., less than or equal to 15 μm, 10 μm, or even 5 μm). As illustration of the above, FIG. 20 illustrates a magnified view 2000 of the substrate 210 having an example original thickness $T_0$ (e.g., average thickness≈700 μm). To achieve the desired thinning, CMP may be applied from the surface 2008 of the substrate 210 down to an example plane 212, thus removing thickness $T_1$ portions while leaving thinned thickness $T_2$ portions. A result is a thinned substrate 210' (FIG. 21).

Figure 18:
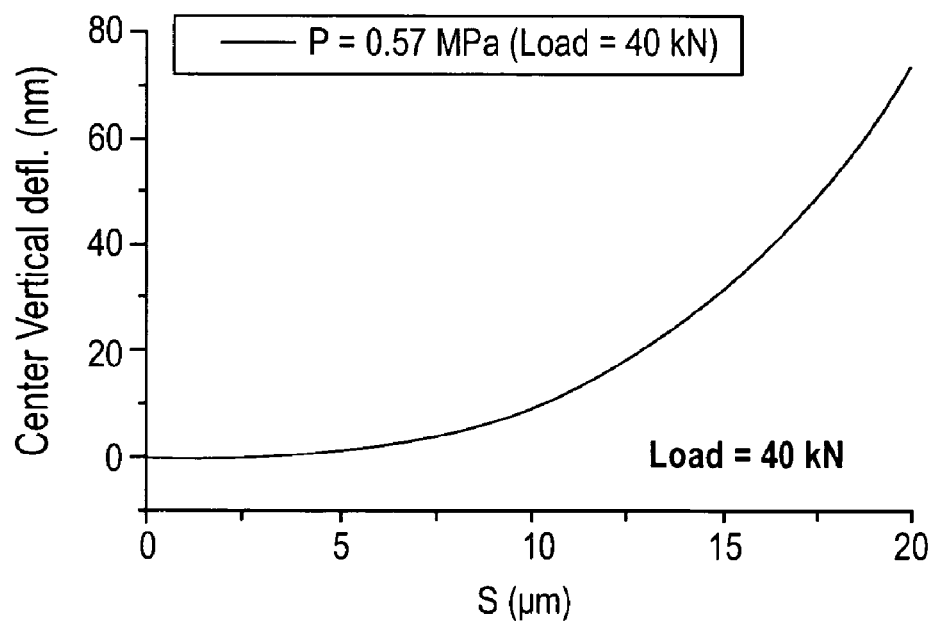

FIG. 18 is a graph detailing calculated results showing deflection of thinned silicon wafers (e.g., average thickness≈10 µm) for an applied force of 40 kN as a function of the spacing "s" between copper structures. (This graph was obtained by finite element analysis.) It can be seen that appreciable deformation of the silicon wafer can be attained for copper structures even with a spacing of only 10 µm, as long as a conformal pressure is applied. These calculations suggest that it is possible to perform low temperature bonding of patterned copper structures and still take into account and compensate for any pillar height variations after a planarizing (e.g., chemical mechanical polishing) process.

Accordingly, it can be seen that a reason for a two-step bonding process is to temporarily pause, and to use a substrate thinning process to achieve a thin silicon wafer (having, for example, a 15 µm, 10 µm, or 5 µm average thickness) that is more compliant (flexible) than a thick wafer (700 µ thick wafer, for example). Such compliance helps in allowing subsequent deflective bonding of any regions that did not bond in the first operation due to pillar height variations in the die or wafers.

That is, FIG. 21's magnified view 2100 shows that, with an example 10 µm inter-pillar spacing 290, application of pressure PRES may result in localized deflection DEFL (shown in exaggerated form) of the thinned substrate 210', such that the normally-gapped pillar pair 230'S, 240' is brought into contact with one another. Bonding may be applied while the pillar pair 230'S, 240' are held in contact with each other with application of continued pressure PRES, with bonding being conducted with high pressure (≈40 kN). Again, low temperature bonding may be used. FIG. 21 further shows that distorted inter-substrate voids 670' (geometrically different from previously-discussed voids 670) may be formed as a result of substrate and/or pillar deflection.

FIG. 22's magnified view 2200 shows that the pillar pair 230'S, 240' may remain permanently bonded 260, and the thinned substrate 210' may maintain permanent deflection PDEFL, even after bonding pressure PRES has been removed. Hence, FIGS. 18 and 20-22 show the viability of a low temperature bonding approach of 3D-ICs having patterned structures with pillar height variations. That is, a viable two-step bonding process may include thinning a backside of at least one die or wafer, and then a repeated pressured bonding to achieve successful bonding of patterned copper structures.

Figure 5:
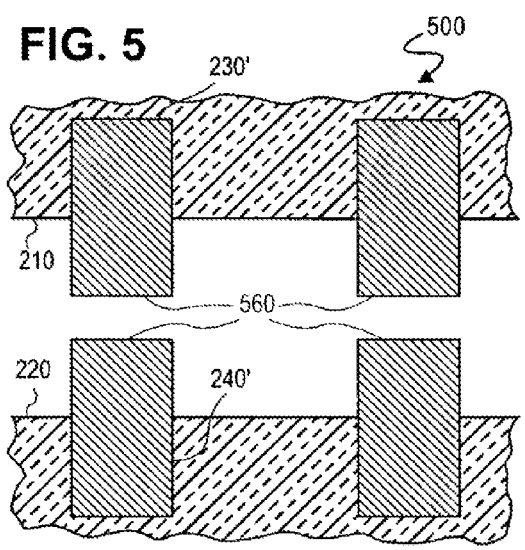
FIGS. 5-6 are cross-sections illustrative of a first advantageous embodiment found to enhance manufacturability and/or reliability of 3D-ICs.
Figure 6:
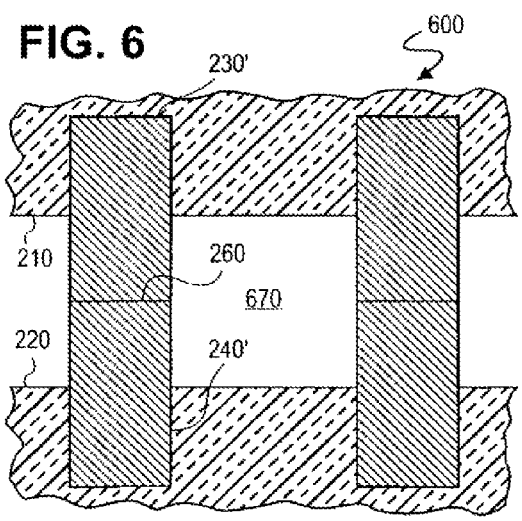

Practice of the FIGS. 20-22 embodiment (and other embodiments discussed ahead) may be combined with practice of the FIGS. 5-6 embodiment. That is, a combined process flow may include: (1) obtaining a clean Cu surface by etching or chemical reaction prior to bonding to obtain low interfacial resistance; (2) bonding at low temperatures; and, (3) the two-step bonding process including thinning of the backside of at least one die or wafer. Such combination may enable successful bonding of patterned copper structures.

Additional problems may plague 3D-IC manufacturability and/or reliability, i.e., such problems may include, for example, die or wafer chipping during thinning, undesirable diffusion, electromigration and corrosion.

Figure 19:
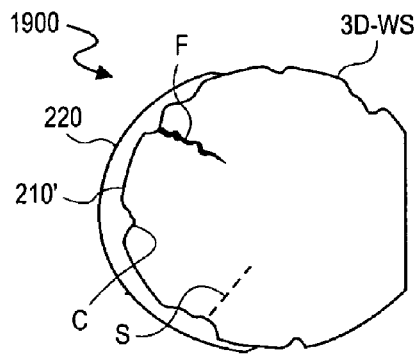
FIG. 19 shows a perspective view of a disadvantageous example 3D-WS having a thinned wafer plagued by substantial chipping, stresses and/or fractures.

Turing first to a chipping problem, as discussed previously with respect to FIGS. 20-22, a thinning process (e.g., CMP) may be applied to at least one substrate of a 3D-IC. Such thinning process may involve application of significant pressure across an entirety of the die or wafer surface, including unsupported peripheral edges of the die or wafer. FIG. 19 shows a perspective view 1900 of wafer 220 and thinned wafer 210' bonded together in an example 3D-WS.

In the FIG. 19 example, it can be seen that as a result of pressure during the thinning process, substantial chips C may have broken off from unsupported peripheral edges of the wafer 210. Such chipping is disadvantageous in that the loose chips represent potential contamination issues in subsequent manufacturing processes. Further, drastic chipping may break away part of a formed integrated circuit which would render that integrated circuit incomplete and inoperable. Still further, drastic chipping may cause stresses S and/or fractures F which may show up at the time of thinning, or which may show up later (e.g., upon repeated thermal cycling of the structure during normal operation thereof). The stresses S and/or fractures F may extend significantly into a central region of the wafer 210'. Any of the chipping C, stresses S and/or fractures F may render the 3D-WS or subsequent 3D-ICs inoperable and/or unreliable. Hence, it is highly desirable, if not necessary, that chipping be avoided.

Figure 7:
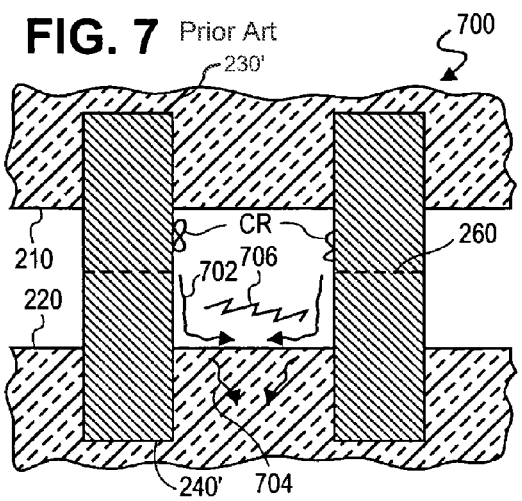
FIG. 7 is a cross-section illustrative of further disadvantageous situations that has been found to possibly negatively affect manufacturability and/or reliability of 3D-ICs.

Turning next to an undesirable diffusion problem, FIG. 7 was used previously to disclose that material (e.g., Cu) from the pillars may diffuse onto and/or into the substrate during high temperature bonding and may cause short-circuiting, leaky paths, etc. Even without high temperature bonding, it was mentioned previously that Cu has been found to have a very high diffusivity, and that such diffusivity exists even for room temperatures. Accordingly, even assuming arguendo that a 3D-IC is never operated, but is stored at room temperature, Cu may continue post-bonding diffusion over time until eventually an operability of the 3D-IC is compromised and/or destroyed. However, most ICs are typically operated (not stored), and given that ICs typically have operational (i.e., ON) temperatures that are significantly higher than room temperature, post-bonding diffusion and eventual inoperability may occur at an accelerated rate over that for room temperature. Hence, it is highly desirable that post-bonding diffusion be avoided or minimized.

Turning next to the electromigration problem, such is a phenomenon in which ion-electron collisions intrinsic to current flow induce physical movement of conductor (e.g., pillar) material. Electromigration (like diffusion) may have a deleterious effect on the lifetime and reliability of the pillar interconnect. Hence, it is highly desirable that electromigration be avoided or minimized.

Turning finally to the corrosion problem, any exposed metal may corrode over time. Using the FIG. 7 arrangement as an example, illustrated is example corrosion CR formed on ones of the interconnection pillars 230', 240'. Corrosion (like diffusion) may effectively decrease an electrical spacing between neighboring pillars, and may result in leaky paths, catastrophic short-circuiting and/or discharges (shown representatively by lightning-bolt 706). Again, as mentioned previously, leaky paths, short-circuiting and or discharges have the potential to destroy an operability of a 3D-IC, and thus, are extremely undesirable. Hence, it is highly desirable that corrosion be avoided or minimized.

Discussion now turns to additional mechanical-support and/or passivation embodiments that may assist in preventing the chipping, various stress-related failures, fracture, post-bonding diffusion, electromigration and/or corrosion problems. Example embodiments will be discussed for both pre-bonding and post-bonding stages, with pre-bonding embodiments being discussed first.

More particularly, FIG. 23's magnified view 2300 shows a partial cut-away of substrates 210, 220 and two example pillar pairs 230', 240'. Thin pre-bonding layers 2325 may be formed onto all exposed (and cleaned) surfaces of the pillars 230', 240'. Such thin layers 2325 may be, as one example, a metal film (e.g., <10 µm or even <10Å) selectively deposited and which will accommodate both the deformation of copper (necessary for the local creep believed to be necessary for bonding) and also serve as a diffusion barrier against copper. Use self-assembly of a conductive coating on the copper surface is one viable option, e.g., using a material which selectively deposits only on copper. Upon bonding, the coating spreads on the copper sidewall and protects it from any corrosion or electromigration. Potential metals include, for example, Ta, Ti, Mg, Al, but practice of the present invention is not limited to such example metals. The choice of proper passivation material for any given implementation may depend upon the choice of pillar material.

As but one non-limiting example, the passivation material may be formed at a thickness within a range of 0.01-0.03 μm.

The thin pre-bonding layers 2325 may alternatively be formed, for example, by the depositing of a metal thin film (e.g., a few monolayers) by atomic layer deposition (ALD) selectively on the copper. Any known ALD process may be used. Atomic layer deposition has excellent step coverage and can fill trenches effectively since the growth mechanism is a layer-by-layer mode.

FIG. 24's magnified view 2400, in turn shows the substrates 210, 220 and pillars 230', 240' after having been subjected to a bonding operation. It is noted that, in this example, portions of the thin layers 2325 may remain sandwiched between each pillar pair 230', 240', and may participate in the bond. In such case, care should be taken to insure that a material of the thin layers 2325 will help provide a sufficient bond responsive to the subject bonding operation of record (BOOR). That is, a sufficient bond 260' should be established not only between the opposing thin layers 2325, but a sufficient bond should be established or maintained between each thin layer 2325 and the pillar material (e.g., Cu). Again, bonding with the thin layers 2325 should also accommodate pillar deformation and/or creep. The thin layer 2325 material should be selected to provide stable, long-term protection throughout an anticipated life of the 3D-IC.

Turning to another example embodiment, FIG. 25's magnified view 2500 illustrates an example seed layer embodiment. More particularly, shown are Cu (Al or Mg) alloy seed layers 2525 deposited at a pre-bonding time (e.g., after pillar cleaning) onto exposed surfaces of the ILD. FIG. 26's magnified view 2600, in turn shows the substrates 210, 220 and pillars 230', 240' after having been subjected to a bonding operation. The seed layers 2525 will serve as both a diffusion barrier layer and also aid in reducing electromigration. Moreover, any Al or Mg, for example, within the seed layer 2525 will selectively segregate to the side walls and form a protective layer of oxide ($Al_2O_3$ or MgO) which will minimize Cu diffusion. Again, the choice of proper passivation material for any given implementation may depend upon the choice of pillar material.

As yet another pre-bonding embodiment, exposed surfaces of the substrates 210, 220 and pillars 230', 240' may be coated with a thin polymer layer (which is also a copper diffusion barrier) by a spin-on method. The polymer coating may be very thin (of the order of a few monolayers) and may be easily deformable. The choice of proper passivation material for any given implementation may depend upon the choice of pillar material, and the BOOR. Upon bonding two substrates as shown in FIG. 27's magnified view 2700, the polymer film 2725 may be forced out of the Cu—Cu interfacial region (since it is softer than Cu) and extruded as bunches 2726 or the extruded material may spread out on the sidewalls of the copper bumps. Hence, the polymer material acts as a copper diffusion barrier.

With respect to all of the above pre-bonding embodiments, if localized substrate deflection is to occur (e.g., to accommodate for pillar height differences), the passivation layer should itself be sufficiently flexible and have sufficient adhesion properties so as not to crack and/or peel (delaminate) away from locally-deflecting substrate portions and/or pillars. Cracking and/or peeling may have deleterious effects on the subsequent chipping, stress, fracture, diffusion, electromigration and/or corrosion protection.

While all of the above pre-bonding embodiments help in the prevention of, post-bonding diffusion, electromigration and/or corrosion problems, such embodiments may be somewhat limited in helping in the prevention of chipping, stress and/or fractures. That is, chipping, stress and/or fractures may still occur since only thin and/or no layers are provided onto the substrate surfaces 210, 220, and only limited or no additional mechanical support is afforded to the substrates.

Discussion turns now to a FIGS. 8-11 pre-bonding embodiment that may provide significant additional mechanical support against chipping, stress and/or fractures, in addition to diffusion, electromigration and/or corrosion protection. In order to enhance/preserve mechanical integrity, it is very useful to entirely (or substantially) fill the inter-substrate (e.g., Cu—Cu) regions of 3D-IC with some type of support material. Although an example embodiment will now be described using a polymer as a support material, practice of embodiments of the present invention are not limited to a polymer. In addition to support, the support material (e.g., polymer) can also be selected to help to inhibit corrosion and/or increase the electromigration resistance by passivating exposed copper surfaces.

Figure 8:
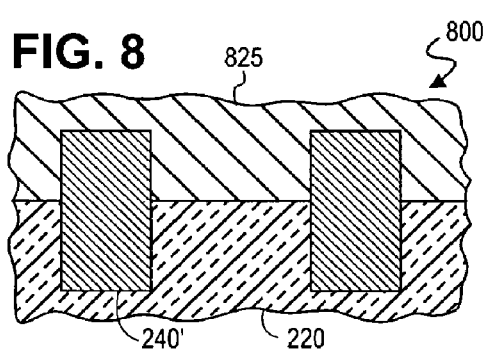
FIGS. 8-11 are cross-sections illustrative of another advantageous embodiment found to enhance manufacturability and/or reliability of 3D-ICs.

More particularly, FIG. 8 is a magnified, cross-sectional view 800 showing a partial cut-away of one substrate 220 and two example pillars 240'. A mechanical-support and/or passivation layer 825 (e.g., polymer) is disposed (e.g., by spin-on techniques) to cover (e.g., entomb) the substrate 220 and pillars 240'. A planarization process (e.g., CMP) may then be applied to remove any excessive layer 825 material extending above the pillars, and so as to expose and achieve planarized pillars 240" having planarized pillar surfaces 860 (see magnified, cross-sectional view 900 in FIG. 9).

An optional selective etch (shown representatively by FIG. 9's etch arrow 935) may then be applied to remove further layer 825 material (while not etching pillar 240' material), so as to achieve a concaved layer surface 825' (shown in exaggerated form) and cleaned pillar surfaces 860. The selective etch 935 may be any known substrate material removal process such as chemical mechanical polishing, wet or dry etching. One purpose of the concaved layer surface 825' might be to set back the layer 825 so that it does not interfere in a subsequent bonding process. Another purpose might be to allow for any layer 825 expansion during the bonding process. That is, upon bonding, the polymer may (by selection of appropriate materials) flow or expand to create a seamless barrier surrounding the copper bumps.

Figure 9:
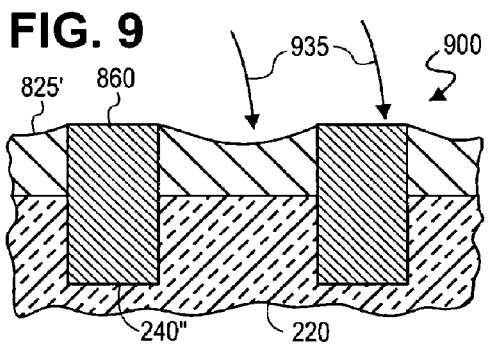

The FIGS. 8-9 layer deposition, planarization and etch back operations are also applied to the opposing substrate 210.

Figure 10:
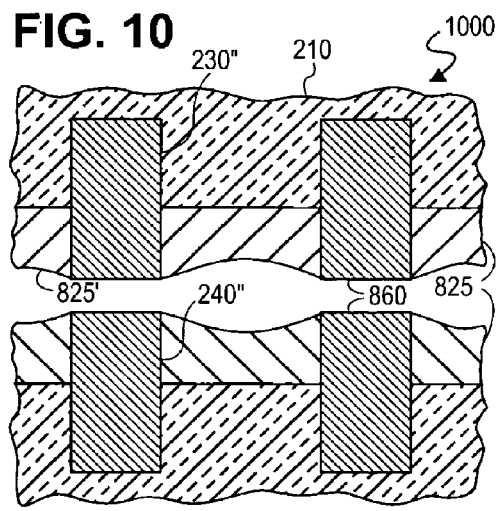
Figure 11:
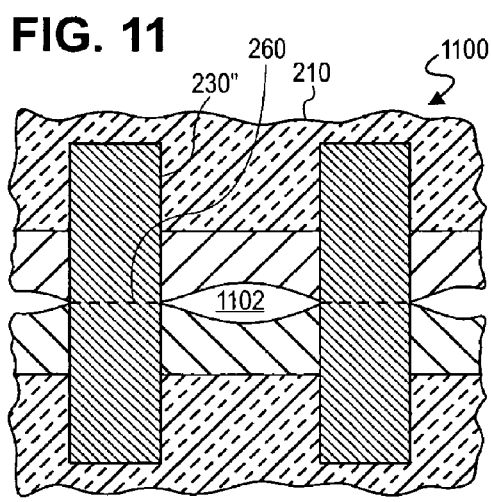

FIG. 10's magnified, cross-sectional view 1000 shows both treated substrates 210, 220 with planarized pillar pairs 230", 240" approaching each other for bonding. FIG. 11's magnified, cross-sectional view 1100, in turn, shows the treated substrates after bonding. Of particular interest, inter-layer voids 1102 (shown in exaggerated form) may be formed where concave portions of the concaved layer surfaces 825' oppose each other. That is, small voids may appear within the polymer layers, perhaps due to the incomplete filling, flow and/or expansion of the polymer.

One possible alternative to the above-discussed FIGS. 8-11 embodiment would be to apply excessive layer 825 material to only one of the substrates (e.g. 220) as shown in FIG. 8, while applying no layer 825 to an opposing substrate. In this embodiment, a process is not used to remove any of the excessive layer 825, and instead, the opposing substrates 210, 220 are pressed together and bonded so as to allow portions of the excessive layer 825 to flow into and passivate the other substrate. The viscosity of the layer 825 material during the bonding process may be such so as to allow extrusion of the layer 825 material from between the pillar pairs 230', 230', and also adequate flow onto opposing areas/structures of the opposing substrate.

To summarize, by proper selection of a material (i.e., passivation material) for the layer 825, the FIGS. 8-11 example embodiment may enable pre- and post-bonding protection (e.g., passivation) of the pillar surfaces, and at the same time provide enhanced protection to avoid disadvantageous die or wafer chipping during thinning. The choice of proper passivation material for any given implementation may depend upon the choice of pillar material. Further, by proper selection of a material (i.e., mechanically-supportive material) for the layer 825, the FIGS. 8-11 example embodiment may provide additional integral support for a die or wafer destined for thinning, so as to prevent chipping, stress and/or fractures in 3D-IC applications. The choice of proper supportive material for any given implementation may depend upon many factors, e.g., the material stiffness, adhesion properties, etc.

One consideration that may be important is that if thinning and the aforementioned two-step bonding process are to be performed with respect to the FIG. 11 bonded arrangement (e.g., to attempt to compensate for pillar height differences), then an effect of the layer 825 material upon a thinned die or wafer's ability to be locally deflected via pressure must be taken into consideration. That is, a thickness combination of a thinned die or wafer and the layer 825 should allow sufficient deflection to occur to compensate for expected pillar height differences that may be present in practice.

Further, the passivation layer should itself be sufficiently flexible and have sufficient adhesion properties so as not to crack and/or peel (delaminate) away from locally-deflecting substrate portions and/or pillars. As mentioned previously, cracking and/or peeling may have deleterious effects on chipping, stress, fracture, diffusion, electromigration and/or corrosion protection.

Discussions turn next to example post-bonding embodiments. That is, once 3D-SSs are bonded, there are a number of post-bonding possibilities that may help at chipping, stress, fractures, diffusion, electromigration and/or corrosion protection. One approach (not of interest to the present invention) would be copper guard rings provided at a periphery of 3D-SSs bonded together to seal the inter-die/chip/wafer area and hence protect the copper pillars/interconnects from exposure to ambient environments. In case there are no guard rings, then there are different approaches to filling the regions between the bonded wafers. The following example embodiments of the present invention can help protect from chipping, stress, fractures, diffusion, electromigration and/or corrosion protection.

As a first post-bonding approach of interest, there may be the depositing of a metal thin film (e.g., a few monolayers) by ALD selectively onto any exposed pillar material (e.g., Cu). Again, ALD has excellent step coverage and can fill trenches effectively since the growth mechanism is a layer-by-layer mode. The metal thin film may act as a protection against diffusion of copper on the ILD surface thereby reducing probability of shorting devices.

As one possible challenge in post-bonding processes, an inter-die/chip/wafer spacing (FIG. 2's dimension 280) may be extremely small (e.g., 0.01-0.2 µm), and inter-pillar spacing (FIG. 2's dimension 290) may also be extremely small (e.g., 1-50 µm). This makes it very difficult to perform post-bonding deposition of materials onto the substrates 210, 220 and pillars 230', 240'. That is, any post-bonding approach must be able to sufficiently penetrate and treat significant deep micron-sized inter-substrate spacings within an acceptable time with respect to a manufacturing process.

As one approach, a so-called super critical carrier gas such as $CO_2$ may be used to penetrate and fill the space between the wafers, and deposit a polymer diffusion barrier. That is, supercritical $CO_2$ has a nominally zero surface tension and can effectively penetrate into the various sub-micron-sized regions between the bonded wafers. As a result, the polymer film can be delivered to and coat the entire exposed copper surfaces effectively after bonding and serve as a diffusion barrier and electromigration mitigation coating during device operation. If it is desired that polymer not be deposited onto non-opposing surfaces of the substrates 210, 220, such surfaces may be protected during deposition. After sufficient coating time, any super critical $CO_2$ carrier gas and residual (i.e., non-bonded) polymer material may be pumped away from the 3D-SS (e.g., pumped out of a processing chamber). FIG. 16's magnified view 1600, shows thin passivation layers 1645 formed on all inter-die/chip/wafer surfaces of the 3D-SS, including opposing surfaces of the substrates 210, 220, and exposed surfaces of the pillar pairs 230', 240'.

A next example embodiment involves the use of liquid to penetrate and treat the various micron-sized regions between the bonded substrates. More particularly, FIG. 12's simplistic cross-sectional view 1200 shows the example of a 3D-WS being at least partially immersed into a bath of liquid solution SOL. Since the inter-substrate spacings are micron-sized, capillary action (show representatively by the FIG. 12 arrows designated CAP) may be used to fill a polymer and/or organic material in between the bonded wafers.

Experimentation was conducted with the FIG. 12 setup using water as a solution SOL to verify a viability of using capillary action to deliver protective coatings. More particularly, 300 mm wafers bonded together as a 3D-WS were partially immersed into the water solution. After a predetermined short time, e.g., one hour, scanning acoustic microscopy (SAM) was used to determine/verify water penetration into the inter-wafer spacings. FIG. 13's partial plan view 1300 shows an example representative result of the water which had entered between the bonded wafers through capillary action. That is, inter-substrate regions penetrated by water appear darker than regions without. Accordingly, FIG. 13's view shows that water has penetrated most inter-wafer spacings. However, there are still regions 1302 where water has not penetrated within the short period of time.

Further experimentation was conducted by leaving the 3D-IC in the water for longer periods of time. After being exposed to water for nearly 20 hours, SAM was again used to determine/verify any improvement of water penetration into the inter-wafer spacings. FIG. 14's partial plan view 1400 shows an example representative result that demonstrates that water can be seeped into the wafers entirely (note absence of any whiter area contrast). This result agrees reasonably with model calculations performed for water rising through a narrow channel.

More particularly, as to model calculations for water seeping into bonded wafers by capillary action, the time (t) taken for a liquid to penetrate a distance I in a cylindrical tube of radius r is given by the equation below (Deutsch, S. A, 1979, Journal of Research of the National Bureau of Standards, 84, 287):

$$t = \frac{2l^2\eta}{r\sigma_{LG}\text{Cos}\theta}$$

where θ is the contact angle of the liquid with the tube, $\sigma_{AG}$ is the air-liquid surface tension of the liquid and η is the viscosity.

Substituting values for water at room temperature and assuming a value of 0.5 for cosine of the contact angle, the time taken to penetrate a distance of 150 mm (half the diameter of a 12" wafer) through a cylindrical channel of 0.1 μ diameter is approximately 11 hours, which is in agreement with experimental results.

This gives the order of magnitude of an example time required. Such times can vary depending on the exact interlayer dielectric used and the contact angle as well as the solvent bath used. In the present actual experiment, the inter-substrate spacing may be viewed as thousands of small tubes immersed into the solvent bath. The results agree well qualitatively with the SAM results. These results suggest that sealing of the bonded wafers with a polymer should work effectively.

Instead of water, the solution SOL may be a solvent containing a polymer or organic material dissolved therein. That is, typically solvents have viscosity lower than water, hence similar or even better results can be expected for solvent penetration times in between the bonded pairs. Again, upon immersion of the 3D-IC, the solvent is drawn into the space between the bonded wafers through capillary action. The solvent may be chosen such that it has a low viscosity for ease of flow into the narrow inter-substrate channels. The wafers and/or the solvent may also be heated to moderate temperatures in order to decrease the viscosity of the solvent (since usually viscosity decreases linearly with temperature). Such may decrease a penetration time.

After adequate penetration has been conducted, the sample may be then cured to form a good seal. That is, after filling the open regions with the solvent, the sample may be cured (e.g., via heat and/or light) to evaporate the solvent so as to leave a solidified layer of polymer. More particularly, FIG. 16 can again be used to show thin sealing passivation layers 1645 formed by evaporation of the carrier solvent to leave polymer or organic materials on all inter-substrate surfaces of the 3D-SS, including opposing surfaces of the substrates 210, 220, and exposed surfaces of the pillar pairs 230', 240'.

While the above carrier solvent embodiment discusses deposition of a polymer passivation layer, practice of the present invention may alternatively include a carrier solvent that performs post-bonding deposition of a seed layer as a passivation layer such as FIG. 25-26's Al or Mg alloy seed layers 2525. That is, upon evaporation of the carrier solvent, the alloy seed layers 2525 form (e.g., solidify) onto at least the exposed surfaces of the ILD within the inter-substrate spacing. As but one non-limiting example, the passivation material may be formed at a thickness within a range of 0.01-0.03 μm.

Further, it is not required that a carrier solvent, or thin deposition layers, be used. For example, if a passivation material liquid (e.g., polymer) has sufficiently low viscosity, such liquid may itself be able to entirely fill the inter-substrate spacings as a passivation material as is shown by material 1545 in FIG. 15's magnified view 1500.

Once cured, the sealant material may provide additional mechanical support for the bonded wafers during further processing. Such mechanical support can again suppress edge chipping during grinding or dicing of the wafers and can increase the die yield significantly. Again, more solid deposition of inter-substrate passivation material (such as shown in FIG. 15.) may have the advantage of providing increased mechanical support over that of a thin deposition layer.

Accordingly, the above post-bonding embodiments use the concept of capillary action to significantly improve the yield of bonded copper wafers.

At this point, it is noted that practice of the present invention may include a case in which the penetration is not complete, and also a case in which the penetration delivery is done at the die level (i.e., after bonding and dicing).

Turing now to a non-capillary example embodiment of the present invention, in another approach, a polymer with low viscosity may be directly injected (e.g., via pressure) into the region between the bonded wafers. Such may be done, for example, by clamping the 3D-IC within a vice-like arrangement which provides external support to the outside of the wafers, while at the same time affording an injection port within which to inject the polymer (e.g., via high pressure) between the bonded substrates, and an exhaust port to exhaust air. The injected polymer may be caused to fill up the entire space between the bonded wafers. More particularly, FIG. 15 can again be used to show solid passivation layers 1545 between all inter-die/chip/wafer surfaces of the 3D-IC, including opposing surfaces of the substrates 210, 220, and exposed surfaces of the pillar pairs 230', 240'. Again, curing of the passivation layer may be performed if necessary.

In at least partially summarizing, passivation/support embodiments may include: (1) Selective deposition of thin metal films of Ta, Au, Al, Mg on copper as diffusion barriers, (2) Coating copper surfaces with a relatively thin polymer film prior to bonding which will squeeze out during the copper deformation process forming a protective layer around the exposed copper bumps, (3) Coating of the copper surface prior to bonding with a spin-on diffusion barrier, etching the top few monolayers and allowing the polymer to expand during the bonding process leading to reduced copper migration, (4) backfilling bonded wafers or bonded die with a copper diffusion barrier using atomic layer deposition, (5) using super-critical $CO_2$ as a carrier to deposit a passivation layer after bonding.

Application of any embodiment of the present invention can increase the yield and reliability of 3D-IC arrangements significantly.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment or component, it is submitted that it is within the purview of one skilled in the art to effect such feature, structure, or characteristic in connection with other ones of the embodiments and/or components. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A semiconductor device comprising:
    at least two stacked semiconductor substrates;
    a plurality of bonded opposing bumps provided on and bonding opposing ones of the at least two stacked semiconductor substrates together with one another, with ones of the bonded opposing bumps to provide electrical conduction paths between the opposing ones of the at least two stacked semiconductor substrates, and where the plurality of bonded opposing bumps are oxide/contaminant cleaned, low-temperature bonded opposing bumps; and,
    at least one of:
    post-bonding deposited passivation layers on at least one of: exposed substrate surfaces of an inter-substrate spacing between opposing ones of the at least two stacked semiconductor substrates; and, exposed bump surfaces of the inter-substrate spacing between opposing ones of the at least two stacked semiconductor substrates;
    a post-bonding deposited mechanical support layer on exposed substrate surfaces of an inter-substrate spacing between opposing ones of the at least two stacked semiconductor substrates; and,
    at least one thinned substrate having at least one localized substrate deflection at irregularly-sized ones of the bonded opposing bumps.

2. A device as claimed in claim 1, wherein the bonded opposing bumps are at least one of etching, chemical reaction, heating and mechanical cleaned opposing bumps.

3. A device as claimed in claim 1, wherein the low temperature bonded opposing bumps are <200° C. bonded opposing bumps.

4. A device as claimed in claim 1, wherein the post-bonding deposited passivation layers are at least one of: gaseous, vapor, chemical and atomic layer deposition (ALD) passivation metal layer; gaseous, vapor, chemical, carrier solvent, injected and capillary passivation polymer material layer; and, gaseous, vapor, chemical, carrier solvent and capillary passivation seed material layer.

5. A device as claimed in claim 1, comprising the post-bonding deposited passivation layers on both the exposed substrate surfaces and the exposed bump surfaces of the inter-substrate spacing between opposing ones of the at least two stacked semiconductor substrates.

6. A device as claimed in claim 1, wherein the at least one thinned substrate is at least one of an etching, ablation, cleaving, grinding and chemical mechanical polishing (CMP) thinned substrate.

7. A device as claimed in claim 1, wherein the at least one thinned substrate has a thinness in a range of 15 µm to 5 µm average thickness.

* * * * *